United States Patent [19]

Farn

[11] Patent Number: 5,361,132
[45] Date of Patent: Nov. 1, 1994

[54] BACK TO FRONT ALIGNMENT OF ELEMENTS ON A SUBSTRATE

[75] Inventor: Michael W. Farn, Burlington, Mass.

[73] Assignee: Massachussetts Institute of Technology, Cambridge, Mass.

[21] Appl. No.: 980,679

[22] Filed: Nov. 24, 1992

[51] Int. Cl.$^5$ .............................................. G01B 9/02
[52] U.S. Cl. .................................. 356/356; 356/363; 356/354
[58] Field of Search ............... 356/356, 363, 354, 401; 250/561

[56] References Cited

U.S. PATENT DOCUMENTS 5,298,988 3/1994 Everett et al. ...................... 356/373

OTHER PUBLICATIONS

Jahns, et al. "Precise alignment . . . copying techniques", Optics Letters vol. 17 No. 6 Mar. 1992 pp. 390–392.

Flanders, et al., "A new interferometric alignment technique", *Applied Physics Letters*, vol. 31, No. 7, 1977, pp. 426–428.

King, et al., "Photolithographic Mask Alignment Using Moire Techniques", *Applied Optics*, vol. 11, No. 11, Nov. 1972, pp. 2455–2459.

Kinoshita, et al., "A dual grating alignment technique for x-ray lithography", *J. Vac. Sci. Technol.* B., vol. 1, No. 4, Oct. Dec. 1983, pp. 1276–1279.

Nomura, et al., "A New Interferometric Alignment Technique with Holographic Configuration", *Japanese Journal of Applied Physics*, vol. 24, No. 11, Nov. 1985, pp. 1555–1560.

Primary Examiner—Samuel A. Turner
Assistant Examiner—Russell C. Wolfe
Attorney, Agent, or Firm—Robert F. O'Connell

[57] ABSTRACT

A technique for aligning corresponding features on opposite surfaces of a transparent substrate. In one embodiment thereof a laser beam is applied to a pair of grating elements on one surface of the substrate to produce an interference fringe pattern on the opposite surface, the centerline between the grating elements being at a known distance from the features on the one surface and corresponding to the center bright space of the fringe pattern. A reference mark on a movable mask, which reference mark is at the same known distance from feature locations on the mask, is aligned with the center bright space of the interference fringe pattern and the feature locations on the mask can then be used to position features on the opposite surface which are aligned with the features on the one surface of the substrate.

10 Claims, 7 Drawing Sheets

BACK TO FRONT ALIGNMENT OF ELEMENTS ON A SUBSTRATE

This invention was made with government support under Contract Number F19628-90-C-0002 awarded by the Air Force. The government has certain rights in the invention.

This invention relates generally to techniques for aligning elements on opposite surfaces of a transparent substrate and, more particularly, to the use of electromagnetic energy beams, such as laser beams, for generating interference fringe patterns for such purpose.

BACKGROUND OF THE INVENTION

Current techniques for back to front alignment generally fall into two categories, i.e., Moire and dual grating techniques. Moire techniques rely on the generation of Moire fringes from two misaligned patterns, while dual grating techniques rely on replicating identical gratings on the front and back surfaces, measuring the relative strengths of the twice diffracted orders thereof and then calculating the misalignment of the gratings based thereon.

Moire techniques often do not work satisfactorily with relatively thick substrates which are commonly used in many optical applications and cannot produce quantitative data as accurately as desired in many applications. Dual grating techniques are relatively sensitive to process variations, e.g., variations in the substrate thickness, or variations in replicating the gratings, and require relatively complicated and expensive implementations.

It is desirable to devise a technique for providing accurate back to front alignment which can be used with relatively thick substrates and which is not only less sensitive to processing variations but is also relatively simple and inexpensive to implement.

BRIEF SUMMARY OF THE INVENTION

In accordance with one embodiment of the invention, a back to front alignment technique for use with substrates which are transparent to electromagnetic energy uses a pair of grating elements having a reference centerline therebetween provided on the front surface thereof, the reference centerline being at a known position relative to the features present on such surface, which features are to be replicated in an aligned fashion on the opposite or back surface of the substrate. A beam of electromagnetic energy is applied to the grating elements so as to generate an interference fringe pattern having a reference center bright space on the opposite surface of the substrate, the center bright space corresponding to, and being aligned with the reference centerline of the grating elements on the front side.

The position of the center reference bright space of the interference fringe pattern is determined and a corresponding reference marker on a mask element having the locations of the desired features suitably placed thereon is aligned therewith using a suitable aligner system. The locations on the mask of the desired features which correspond to the features on the front surface of the substrate are at the same positions relative to such reference marker as the positions of the features on the front side relative to the centerline of the grating elements.

Accordingly, once the reference marker on the mask is aligned with the reference center bright space of the interference fringe pattern on the back side of the substrate, the features on the back side can be determined from the mask and such features when placed thereon will be automatically aligned with the locations of the features on the front side thereof. Such technique can be relatively easily and inexpensively implemented, using a suitable and known electromagnetic energy source, such as a laser beam source, and an appropriate aligner system.

DESCRIPTION OF THE INVENTION

The invention can be described in more detail with the help of the accompanying drawings wherein.

Figure 1:
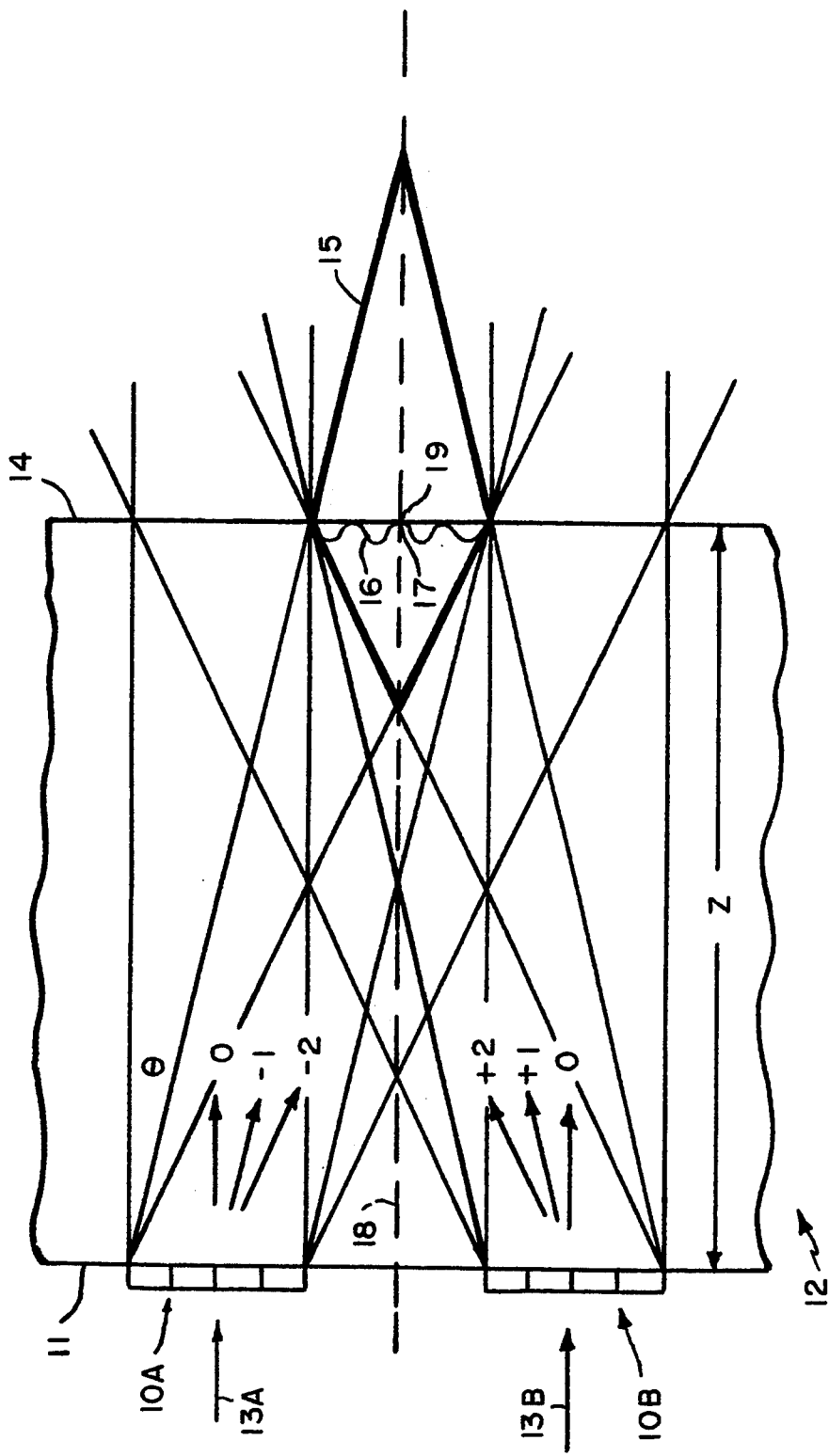
FIG. 1 depicts a portion of a substrate having grating elements and an interference fringe pattern thereon.

The basic concept of the invention can be initially understood with the help of FIG. 1. As seen therein, two identical gratings 10A and 10B each having a period T are provided on a front surface of a substrate 12, a portion of which is depicted in the figure. The gratings have the same width and a centerline 18 lies halfway between them, as shown. If the gratings are illuminated by a monochromatic beam of electromagnetic energy, e.g., a laser beam, such as depicted by beam portions 13A and 13B, each grating will give rise to many diffracted orders. For clarity, FIG. I depicts only the 0, −1, and −2, orders of the top grating 10A and the 0, +1, and +2 orders of the bottom grating 10B. For further clarity, refraction of the diffracted orders at the back surface 14 of substrate 12 are not shown. The front surface 11 is appropriately arranged to prevent transmission of the electromagnetic energy through the substrate at regions other than at the gratings. For example, the surface may have a metallic, e.g., chrome, coating thereon at such regions.

It is noted that in the kite-shaped shaded region 15 depicted therein only the −1 order of the top grating and the +1 order of the bottom grating are present. Therefore, if this region is examined, an interference fringe pattern comprising sinusoidal fringes, e.g., alternative dark bars and bright spaces, having a period T/2, as represented by wavy line 16, are seen to be present. In addition, the fringe pattern is centered between the pair of gratings 10A and 10B so that a centrally located bright fringe space 17 falls on the dashed centerline 18 between the gratings 10A and 10B. Thus, the fringe pattern effectively accurately "marks" the location of the centerline on the back surface 14, i.e., at the center bright space of the fringe pattern. If a reference marker 19 on a mask (not shown) is positioned at the center bright space 17 of the fringe pattern, the marker 19 marks the location of the dashed centerline 18.

The locations of features on the front surface 11 of substrate 12 are accurately known with reference to the centerline 18. The locations of corresponding features on the back surface 14 can then be correspondingly located on a mask with reference to the marker 19 on the mask, the position of marker 19 corresponding to the centerline between the grating elements 10A and 10B. Once the reference marker 19 is aligned with center bright space 17, the feature locations on the mask are correctly aligned with the features on the front side 11 so that by using the mask corresponding features can then be positioned on the back side 14 of substrate 12, such features being thereby aligned with the features on the front side 11. A specific method for practicing the invention in accordance with such concept is discussed in more detail below.

Figure 2:
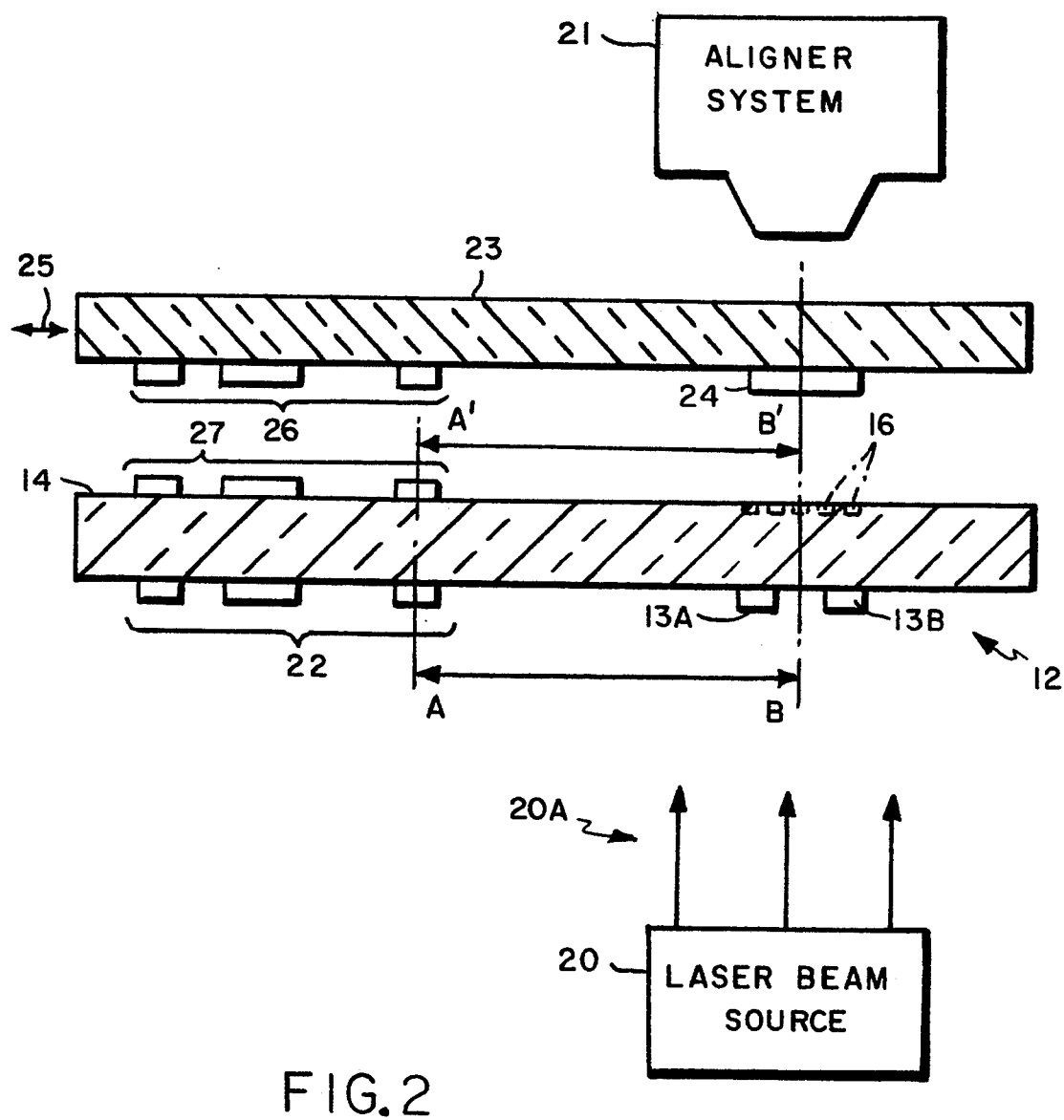
FIG. 2 depicts a block diagram of a system in accordance with the invention for aligning features on opposite sides of a substrate.

As can be seen in FIG. 2, a transparent substrate 12 is mounted between a laser beam source 20 and an aligner system 21. Substrate 12 has a plurality of features 22 positioned on front surface 11 thereof and it is desired that a plurality of features 27 be positioned on the back surface thereof so that the features 27 on the back surface are aligned with the features 22 on the front surface.

In one embodiment of the invention, for example, a pair of grating elements 10A and 10B are suitably etched on front surface 11 at a known and fixed position thereon, such that the centerline between them is at a known location B with reference to the positions of the features, the nearest one of which is at a location A, for example. Thus, the distance between the locations A and B is known and fixed. The locations of the remaining features relative to the feature at location A are also known and fixed.

A laser beam source 20 is arranged to provide a laser beam 20A directed at gratings 10A and 10B so as to produce an interference fringe pattern 16 at the back surface 14 of substrate 12, in the manner as depicted in FIG. 1. A transparent mask 23 has a reference marker region 24 having a known center reference mark thereon, the mask being suitably mounted so as to be moveable in a plane parallel and adjacent to substrate 12, as shown by arrow 25.

The center bright space of the interference fringe pattern is suitably identified by the aligner system 21. For example, an aligner system, such as made and sold by Karl Suss America of Waterbury Center, Vt. under the Model designation MA6, has an optical detector and an alignment display sub-system which responds thereto, and such exemplary system can be used for the purposes of the invention. The aligner system displays the relative positions of the reference marker 24 and the interference fringe pattern 16 so that the mask 23 can be moved until the centerline of reference marker 24 is aligned with the center bright space of the interference fringe pattern. Mask 23 includes, as a part thereof, a plurality of feature locations 26. These locations of which, relative to the reference marker centerline, correspond to the locations of features 22 relative to the centerline of the grating elements 10A and 10B on the front surface of substrate 12. Thus, for example, the location of the feature nearest the reference marker 24 is at location A' and the location of the centerline of reference marker 24 is at location B', such that the distance from A' to B' on mask 23 is the same as the distance from A to B from the location which is to be aligned to the feature at A' to the centerline of grating elements 10A and 10B on the front surface of substrate 12.

Accordingly, when the aligner system 21 aligns the centerline of marker 24 with the center bright space of interference fringe pattern 16, the feature locations 26 on mask 23 are aligned with the locations of features 22 on the front surface of substrate 12 so that, by using mask 23, features 27 corresponding to locations 26 can then be appropriately placed on the back surface 14 of substrate 12. In accordance with such operation, the positions of the features on the back side 14 of substrate 12 are aligned with the locations of features 22 on the front surface 11 thereof.

Figure 3:
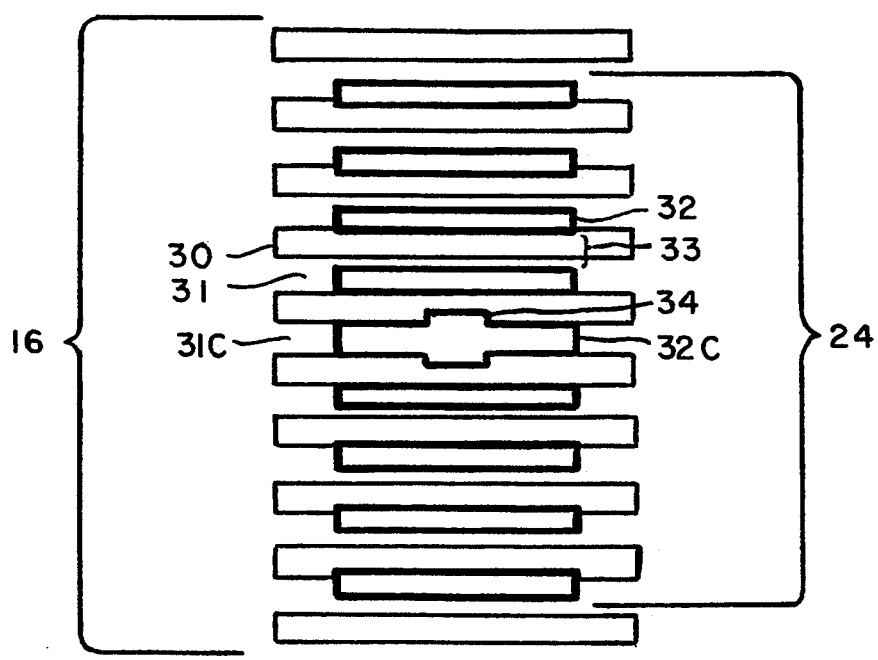
FIG. 3 depicts an exemplary fringe pattern and a corresponding exemplary reference marker in aligned positions in accordance with the operation of the system of FIG. 2.

An example of a technique for aligning an exemplary centerline of a reference marker with the center bright space of an exemplary interference fringe pattern is discussed in more detail with reference to FIG. 3, which shows a display of a portion of the interference fringe pattern, as well as a particular reference marker. As shown therein, the bars 30 and bright spaces 31 therebetween, which extend from one side of the figure to the other, represent an exemplary fringe pattern 16, while the shorter dark bars 32 and bright spaces 33 therebetween represent a reference marker 24 which further includes a dark rectangular area 34 at the center thereof. A bar 32C which passes through the center of rectangular area 34 is identifiable as the centerline of the reference marker region.

In the figure, for example, the period of the grating elements and, hence, the period of the fringe pattern are known. In a specific example, grating elements having a period of 12 microns ($\mu$m.) produce an interference fringe pattern having a period of 6 $\mu$m. In such example, the period of the reference bars of the reference marker is selected to be 5.8 $\mu$m in the particular embodiment being discussed. Accordingly, when the center bar 32C of the reference marker is centered in the center bright space 31C of the fringe pattern 16, as shown in FIG. 3, the desired alignment for determining the feature locations is achieved.

In order to provide such alignment, the aligner system 21 must first approximately locate and identify the center bright space 31C of the fringe pattern to within a specified distance. In the case under discussion, for example, using a single interference fringe pattern having a 6 $\mu$m period, the aligner system must be sufficiently accurate to locate the center bright space 31C to within $\pm 3.0$ $\mu$m. If the center bright space 31C can be initially located to within such range, the center bar 32C of the reference marker can then be moved so that it is centered within the center bright space 31C. When so centered, the mask is then appropriately positioned so that the feature locations thereon are correctly positioned relative to center bar 32C so as to be able to place features at such locations on the back surface 14 of substrate 12, which features are then correctly aligned with the corresponding features on the front surface thereof.

Such process can be used in accordance with the invention if the aligner system being used can accurately determine the center bright space of interference fringe pattern to within a specified range, e.g., a ±3 μm range in the particular embodiment discussed.

Figure 4:
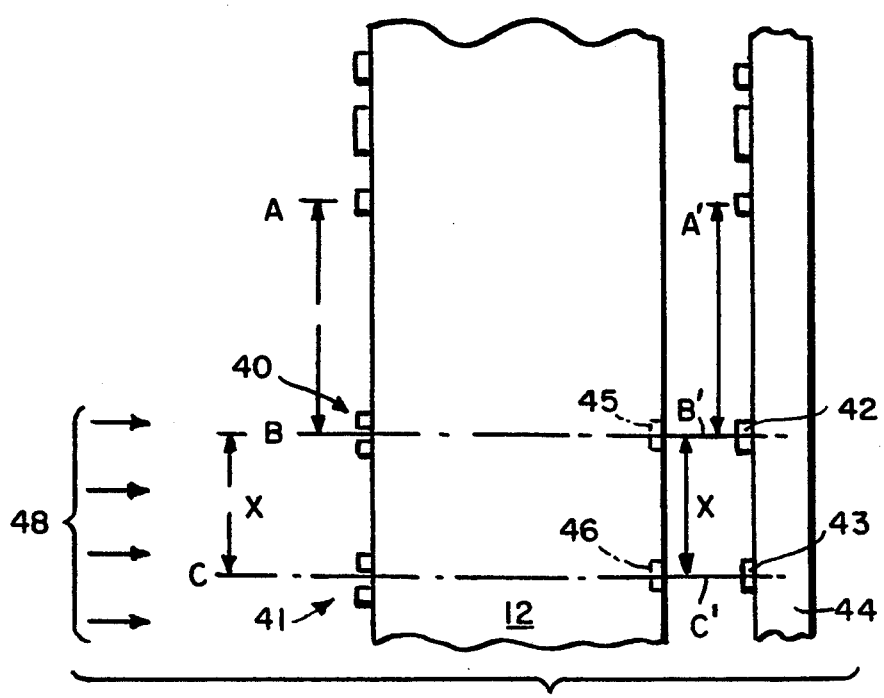
FIG. 4 depicts a block diagram of an alternative embodiment in accordance with the invention.

If the aligner system is unable to locate the center bright space 31C to within such a range, more than one interference fringe pattern can be used for alignment purposes, as discussed below. In such a case, more than one pair of grating elements are used as shown in the embodiment of FIG. 4. As seen therein, a first pair of grating elements 40 and second pair of grating elements 41, each having known periods, are etched on the front surface of a substrate 12, the distance X between the centerlines thereof at locations B and C being known and fixed. The locations of the features on the front surface, e.g., the distances from the nearest feature location at A to the centerlines of grating pairs 40 and 41, are also known and fixed. A pair of reference markers 42 and 43, each having known periods, are positioned on a mask 44, the centerlines thereof also being located at B' and C' having the same distance X therebetween.

If a laser beam 48 is applied to the regions containing both pairs of grating elements, a pair of interfering fringe patterns 45 and 46 are produced at the back surface of the substrate. The periods of the grating elements are selected to be different so as to produce fringe patterns having two different periods.

In a particular embodiment, for example, the grating elements may have periods of 10 μm and 12 μm so as to produce a fringe pattern 45 having a period of 5 μm and a fringe pattern 46 having a period of 6 μm, respectively. In this case, if the aligner system can initially determine the location of the center bright spaces of the fringe patterns 45 and 46 to within ±15 μm (a much less severe requirement than that needed when using only a single fringe pattern), the mask can be moved until the centerlines of reference markers 42 and 43, having periods of 4.8 μm and 5.8 μm, respectively, are each centered at the center bright spaces of the respective fringe patterns 45 and 46. The mask is then correctly positioned to permit alignment of the features.

Figure 5:
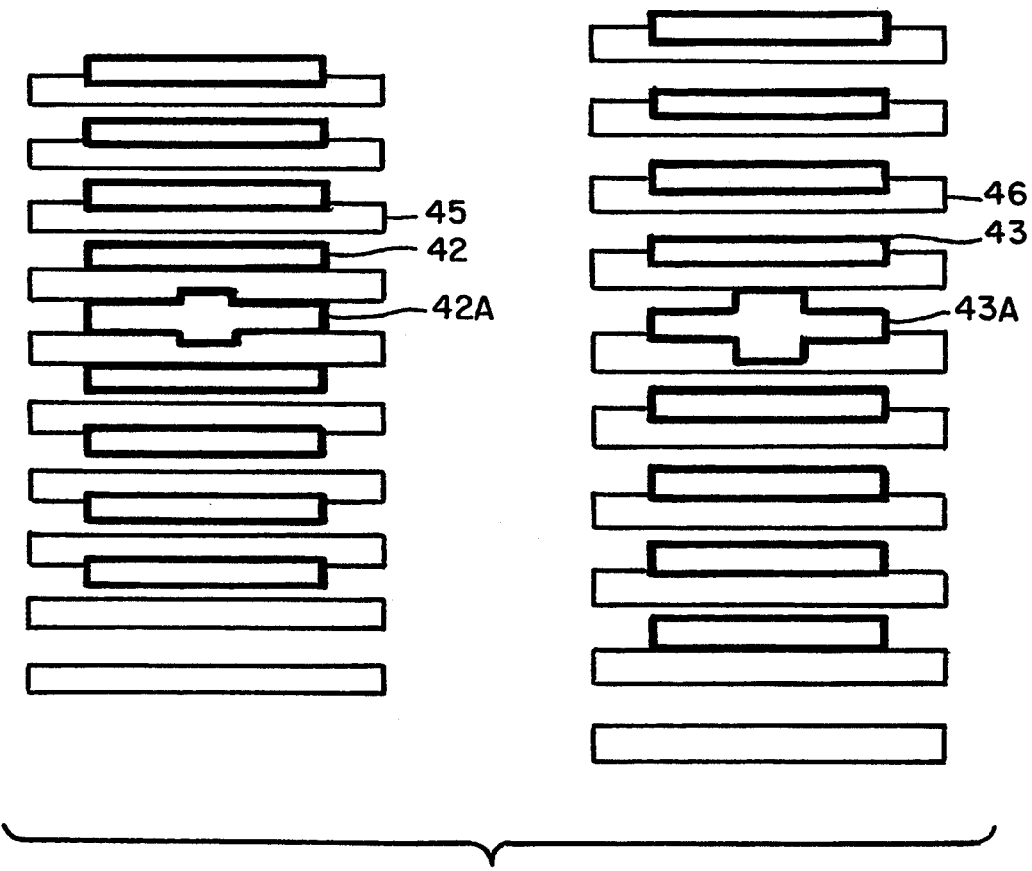
FIG. 5 depicts exemplary fringe patterns and corresponding exemplary reference markers in non-aligned positions in accordance with the operation of the system of FIG. 4.
Figure 6:
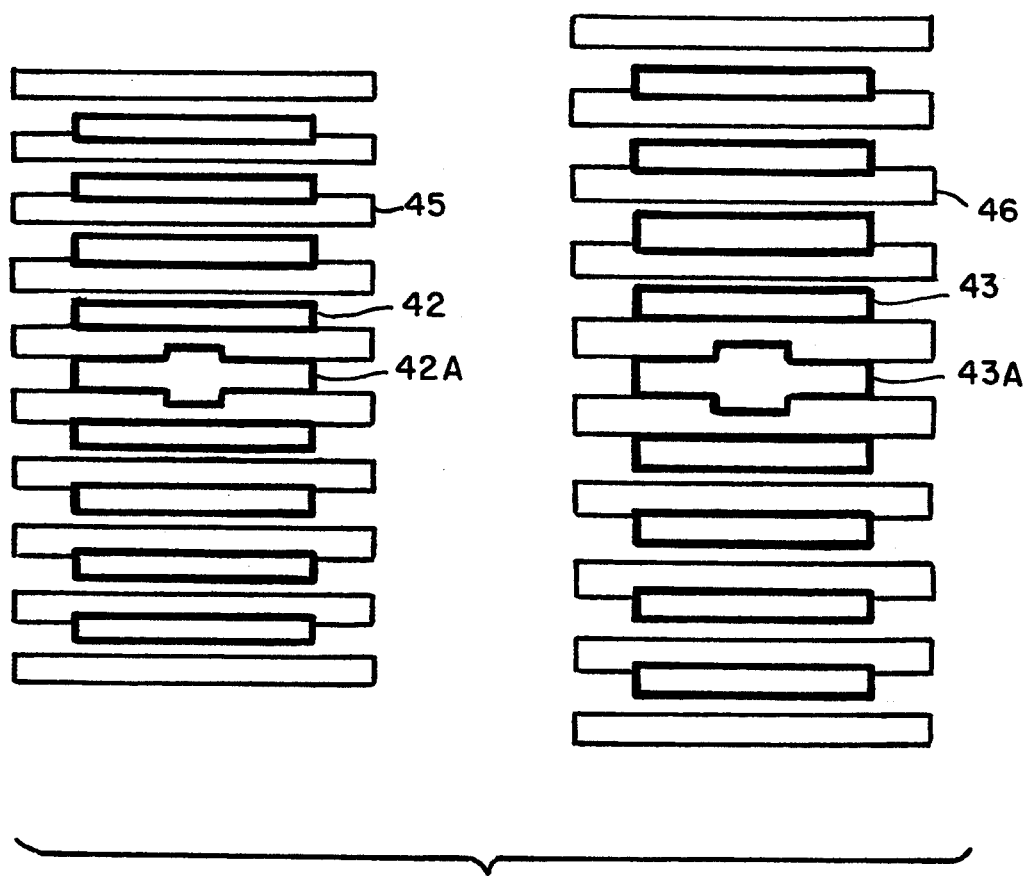
FIG. 6 depicts the fringe patterns and corresponding reference markers of FIG. 5 in aligned positions in accordance with the operation of the system of FIG. 4.

For example, the aligner system may initially be used to move the reference markers to positions as shown in FIG. 5 wherein the centerline 42A of reference marker 42 is centered within a bright space of fringe pattern 45, not necessarily the center bright space thereof but within ±15 μm thereof. The centerline 43A of reference marker 43 may not be centered within a bright space of fringe pattern 46, the display of FIG. 5 showing that the mask is not yet correctly positioned. The mask can then be moved until the centerlines of the reference markers 42 and 43 are concurrently centered in a bright space of their respective fringe patterns, as shown in FIG. 6. Because of the periods selected for the fringe patterns and for the reference markers and because of the accuracy with which the aligner system can initially determine the location of the center bright spaces of the fringe patterns, such mask position is unique within the dimensions defined by the accuracy of the aligner system, e.g., ±15 μm, and can only occur when the centerlines of the reference markers are aligned with the center bright spaces of their respective fringe patterns. At that point the mask is correctly positioned for aligning the features. Thus, the mask can be correctly positioned even though the aligner system can only initially determine the center bright spaces of the fringe patterns to within a range of ±15 μm, when generating fringe patterns having 5 μm and 6 μm periods, respectively, and using reference marker periods of 4.8 μm and 5.8 μm, respectively.

Figure 7:
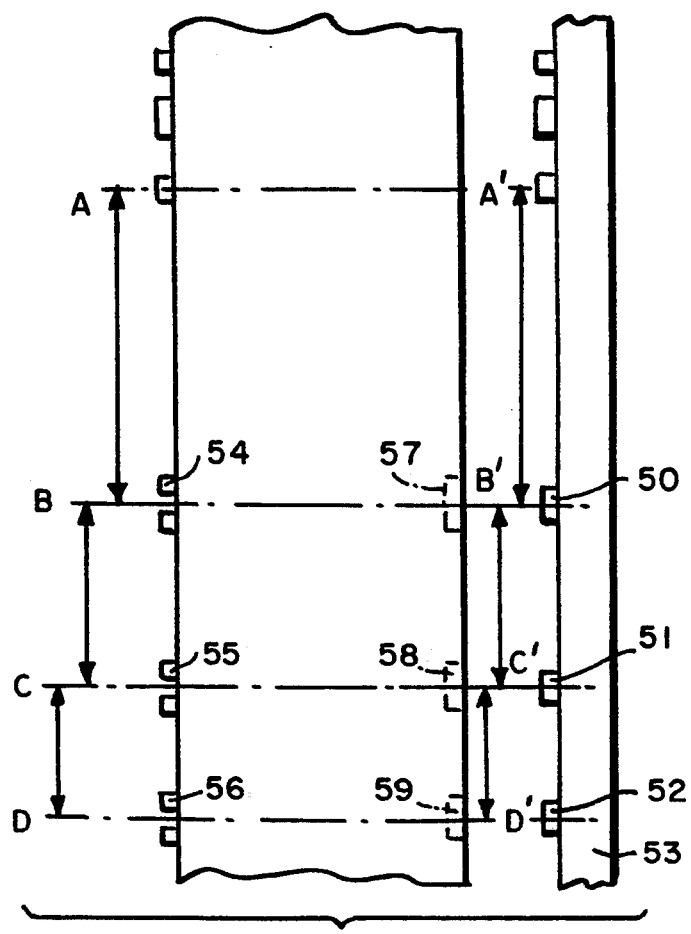
FIG. 7 depicts a block diagram of still another alternative embodiment in accordance with the invention.

In a still further embodiment of the invention, if the aligner system can initially locate the center bright space of the fringe patterns only to within a much larger range, e.g., ±115 μm, the system requires the use of three pairs of gratings having periods of 10 μm, 12 μm and 14 μm, respectively, for producing three interference fringe patterns having periods of 5 μm, 6 μm and 7 μm, respectively, for use with three reference markers having periods of 4.8 μm, 5.8 μm, and 6.8 μm, respectively, on the mask. As shown in FIG. 7, for example, three reference marker regions 50, 51 and 52 can be used on a mask 53 and three pairs of grating elements 54, 55 and 56 having different periods (e.g., 10 μm, 12 μm and 14 μm) can be used to produce three interference patterns 57, 58 and 59, respectively, having periods of 5 μm, 6 μm and 7 μm, respectively. In such case when the centerlines of the three reference markers are concurrently centered in a fixed bright space of their corresponding fringe patterns, the mask is correctly positioned for locating the features on the back side of the substrate.

Figure 8:
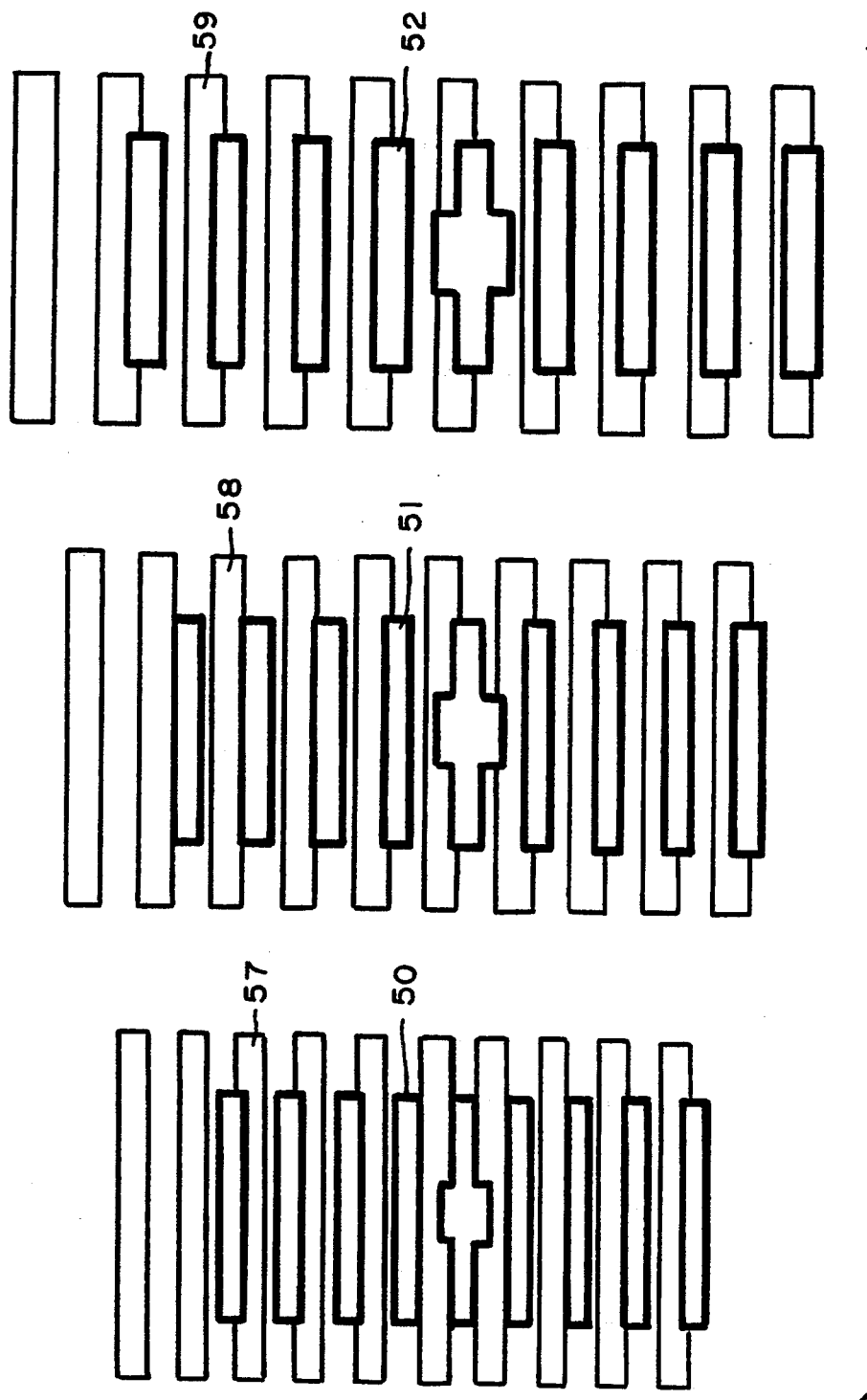
FIG. 8 depicts exemplary fringe patterns and corresponding exemplary reference markers in non-aligned positions in accordance with the operation of the system of FIG. 7.
Figure 9:
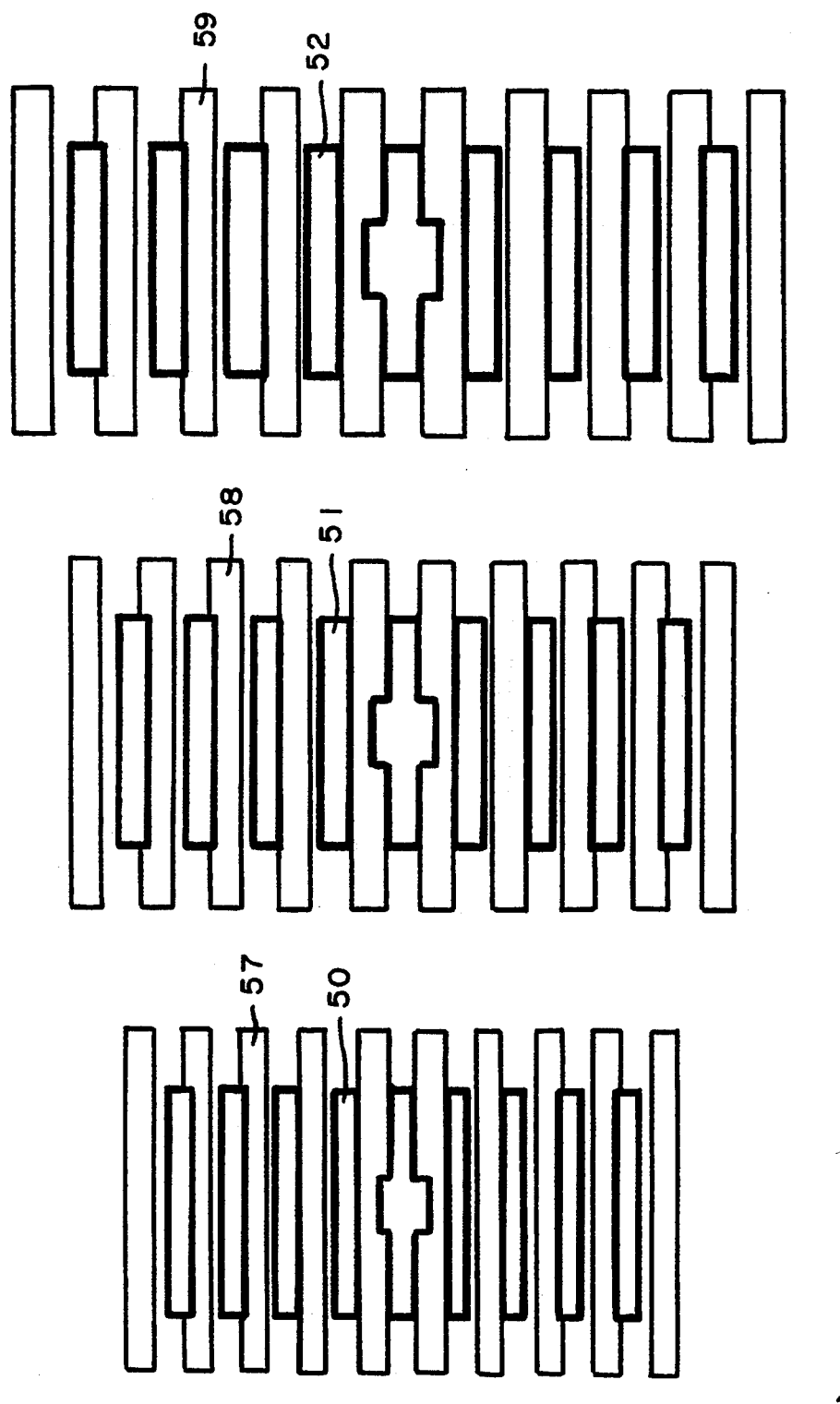
FIG. 9 depicts the fringe patterns and corresponding reference markers of FIG. 8 in aligned positions in accordance with the operation of the system of FIG. 7.

FIG. 8, for example, shows three reference markers in which the three centerlines thereof are not concurrently centered on a bright space of a fringe pattern. FIG. 9 shows the case when the mask has been moved so that all three centerlines of the reference markers are concurrently centered in a bright space of their respective fringe patterns, in which case the mask is then correctly aligned. Thus, correct alignment of the features can be achieved even when the aligner system does not permit the center bright spaces of the fringe patterns to be initially determined to within any better than ±115 μm. e.g., generating fringe patterns having the particular periods specified above.

The numbers of fringe regions and reference markers can be further extended to improve the ability to correctly position the mask even when the ability to initially locate the center bright spaces of the fringe patterns becomes increasingly difficult. For example, if initial alignment is performed by the unaided human eye, the eye may not be able to determine the center bright spaces of the fringe patterns involved to within a range any better than about ±500–1000 μm, for example. In such case, four fringe patterns and four reference markers can be used to achieve the desired alignment in the same manner as discussed above.

While the above alignment techniques have been described for locating features along one dimension (e.g., along an X direction) of the back surface of the substrate, the same technique can also be used to simultaneously locate the features in a direction orthogonal thereto (i.e., in a Y direction) on the substrate, using gratings, fringe patterns and reference marks set up for both directions.

While the particular embodiments discussed above represent preferred exemplary embodiments of the invention, others may occur to those in the art within the spirit and scope of the invention. Hence, the invention is not to be construed as limited to the specific embodiments discussed above, except as defined by the appended claims.

What is claimed is:

1. A method for aligning corresponding features on opposite surfaces of a substrate which is transparent to electromagnetic energy, said method comprising the steps of providing at least one set of elements on one surface of said substrate, a reference line of said at least one set of elements being at a known distance from the positions of features on said one surface;

applying a beam of electromagnetic energy to said at least one set of elements to generate at least one interference fringe pattern on the opposite surface of said substrate having a center reference location thereon which corresponds to the reference line of said at least one set of elements on said one surface;

determining the position of the center reference location of said at least one fringe pattern of said opposite surface;

providing a movable reference member having at least one reference mark thereon and having identifiable feature locations thereon, the positions of which relative to each other correspond to the positions of the features relative to each other on the surface of said substrate, the at least one reference mark being at the same known distance from said feature locations as the distance said at least one reference line is from the positions of features on said one surface; and moving said reference member until said at least one reference mark is aligned with the center reference location of said at least one fringe pattern, whereby the identifiable feature locations on said reference member can be used to position features on the opposite surface of said substrate which are aligned with corresponding features on said one surface of said substrate.

2. A method in accordance with claim 1 wherein said providing step provides a pair of grating elements, the reference line of which is a centerline therebetween and said beam applying step generates an interference fringe pattern, the center reference location of which is a center bright space thereof.

3. A method in accordance with claim 2 wherein said movable reference member providing step provides a mask having a reference element with a center reference mark thereon, said mask further having said identifiable feature locations thereon.

4. A method in accordance with claim 3 wherein said beam applying step applies a laser beam to said pair of grating elements to generate said interference fringe pattern and said positions locating step comprises
displaying the relative positions of said center reference mark on said mask and said interference fringe pattern; and moving said mask until said center reference mark is aligned with the center bright space of said fringe pattern.

5. A method for aligning corresponding features on opposite surfaces of a substrate which is transparent to electromagnetic energy, said method comprising the steps of providing a plurality of pairs of grating elements at selected regions on one surface of said substrate, centerlines between each of the pairs of grating elements being at known distances from one another and from the positions of the features on said one surface;

applying a beam of electromagnetic energy to said plurality of pairs of grating elements to generate a plurality of corresponding interference fringe patterns having different periods on the opposite surface of said substrate, center reference locations of said plurality of fringe patterns on said opposite surface corresponding to the respective centerlines of said plurality of pairs of grating elements;

determining the positions of the center reference locations of said plurality of fringe patterns on said opposite surface; and comparing the relative positions of the center reference locations that have been so determined to confirm that said determinations are substantially correct;

providing a movable reference member having a plurality of reference marks thereon and having identifiable feature locations, the positions of which relative to each other correspond to the positions of the features relative to each other on the one surface of said substrate, the reference marks being at the same known distances from said feature locations as the distances said centerlines of said pairs of grating elements are from the positions of features on said one surface; and moving said reference member until said reference marks are aligned with the center reference locations of said fringe patterns, whereby the identifiable locations on said reference member can be used to position features on the opposite surface of said substrate which are aligned with corresponding features on said one surface of said substrate 6. A method in accordance with claim 5 wherein N pairs of grating elements are provided on the one surface of said substrate and N corresponding interference fringe patterns having N center reference locations are generated on the opposite surface thereof and further wherein said movable reference member is a movable mask having N reference marks and having said identifiable feature locations thereon, the N reference marks being at the same known distances from said identifiable feature locations as the distances of the centerlines of said N pairs of grating elements are from the features on said one surface and said mask is moved until the N reference marks on said mask are aligned with the N center reference locations of said fringe patterns.

7. A method in accordance with claim 6 wherein N is two.

8. A method in accordance with claim 6 wherein N is three.

9. A system for aligning corresponding features on opposite surfaces of a substrate which is transparent to electromagnetic energy, said system comprising means for providing at least one set of elements on one surface of said substrate, a centerline of said at least one set of elements being at a known distance from the positions of features on said one surface;

means for applying a beam of electromagnetic energy to said at least one set of elements to generate at least one interference fringe pattern on the opposite surface of said substrate having a center reference location thereon which corresponds to the centerline of said at least one set of elements on said one surface;

a movable mask having at least one reference mark thereon and having identifiable feature locations thereon, the positions of which relative to each other correspond to the positions of the features relative to each other on the one surface of said substrate, the at least one reference mark being at the same known distance from the feature locations as the distance said at least one centerline is from the positions of features on said one surface;

means for determining the position of the center reference location of said at least one fringe pattern on said opposite surface;

means for moving said mask until said at least one reference mark is aligned with the center reference location of said at least one fringe pattern, whereby the feature locations on said mask can be used to position features on said opposite surface which are aligned with corresponding features on said one surface; and means for locating the positions of features on said opposite surface with respect to the position of the center reference location of said at least one fringe pattern so as to correspond to the positions of the features on said one surface.

10. A system in accordance with claim 9 wherein the enter reference location of said at least one fringe patter is a center bright space thereof and said alignment system includes a display means, said at least one fringe pattern and the at least one reference mark on said mask means being displayed so that the at least one reference mark can be aligned with the center bright space of said at least one fringe pattern.

* * * * *